(12) United States Patent
Um et al.

(10) Patent No.: US 12,183,546 B2
(45) Date of Patent: Dec. 31, 2024

(54) SUBSTRATE PROCESSING APPARATUS

(71) Applicant: ASM IP Holding B.V., Almere (NL)

(72) Inventors: KiChul Um, Osan-si (KR); YongGyu Han, Seoul (KR); SangJean Jeon, Suwon-si (KR); DooHan Kim, Hwaseong-si (KR); SangYeop Lee, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 269 days.

(21) Appl. No.: 17/196,374

(22) Filed: Mar. 9, 2021

(65) Prior Publication Data

US 2021/0287878 A1 Sep. 16, 2021

Related U.S. Application Data

(60) Provisional application No. 62/989,515, filed on Mar. 13, 2020.

(51) Int. Cl.
*H01J 37/32* (2006.01)
*C23C 16/505* (2006.01)

(52) U.S. Cl.
CPC ...... *H01J 37/32137* (2013.01); *C23C 16/505* (2013.01); *H01J 37/32183* (2013.01); *H01J 37/32889* (2013.01); *H01J 37/32899* (2013.01); *H01J 37/32926* (2013.01); *H01J 37/32091* (2013.01); *H01J 37/32577* (2013.01)

(58) Field of Classification Search
CPC ......... H01J 37/32091; H01J 37/32128–32183; H01J 37/3244; H01J 37/32449; H01J 37/32513; H01J 37/32522; H01J 37/32633; H01J 37/32724; H01J 37/32834; H01J 37/32889; H01J 37/32899; H01J 37/32935; H01J 37/3299; H01J 37/32577; H01J 37/32926; C23C 16/45565; C23C 16/4586; C23C 16/505; C23C 16/509; H01L 21/67069; H01L 21/67155; H01L 21/6719; H01L 21/67253
See application file for complete search history.

(56) References Cited

U.S. PATENT DOCUMENTS

| | | | | |
|---|---|---|---|---|
| 4,545,328 A * | 10/1985 | Fujiyama | ............... | C23C 16/455 427/574 |
| 5,712,592 A * | 1/1998 | Stimson | ............ | H01J 37/32165 315/111.51 |
| 6,265,831 B1 * | 7/2001 | Howald | ................... | H03H 7/40 315/111.21 |
| 6,353,201 B1 * | 3/2002 | Yamakoshi | ............... | H05H 1/46 315/111.41 |
| 6,409,837 B1 * | 6/2002 | Hillman | ............... | C23C 16/4486 118/712 |
| 6,630,053 B2 * | 10/2003 | Yamagishi | ........ | H01L 21/68707 156/345.32 |
| 6,913,652 B2 * | 7/2005 | Shan | ................. | C23C 16/45561 156/345.31 |

(Continued)

*Primary Examiner* — Kurt Sweely
(74) *Attorney, Agent, or Firm* — Snell & Wilmer L.L.P.

(57) ABSTRACT

A substrate processing apparatus capable of removing signal interference between reactors includes: a first reactor, a second reactor adjacent to the first reactor, and a power generator configured to supply first power to the first reactor and supply second power to the second reactor, wherein the power generator is further configured to synchronize phases of the first power and the second power.

15 Claims, 18 Drawing Sheets

(56) References Cited

U.S. PATENT DOCUMENTS

| | | | |
|---|---|---|---|
| 8,021,723 B2* | 9/2011 | Fukasawa | C23C 16/505 427/535 |
| 9,371,583 B2* | 6/2016 | Kim | H01J 37/32091 |
| 2013/0284369 A1* | 10/2013 | Kobayashi | B05C 9/00 118/712 |

* cited by examiner

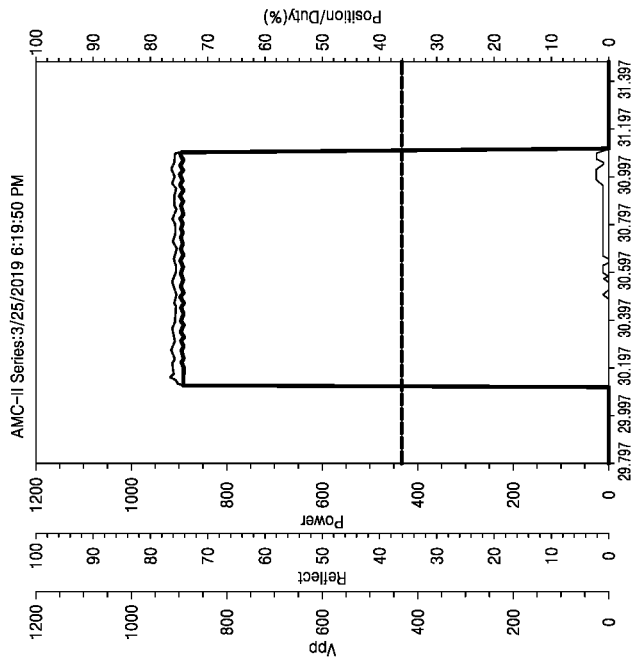
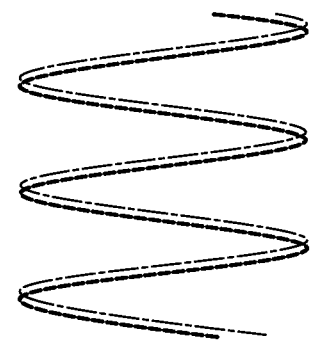
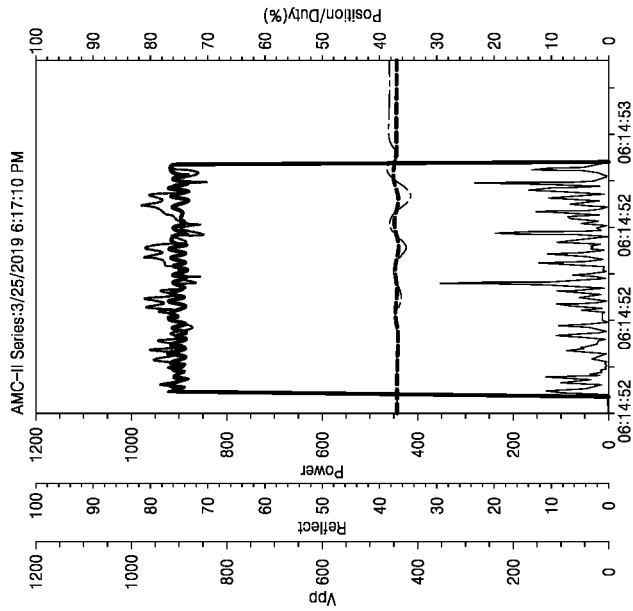
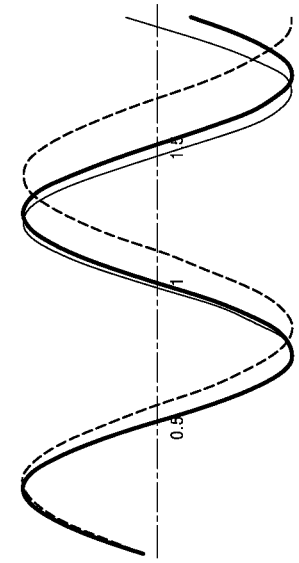
FIG. 15A
FIG. 15B

SUBSTRATE PROCESSING APPARATUS

CROSS-REFERENCE TO RELATED APPLICATION

This application is based on and claims priority under 35 U.S.C. § 119 to U.S. Patent Application No. 62/989,515, filed on Mar. 13, 2020, in the United States Patents and Trademark Office, the disclosure of which is incorporated by reference herein in its entirety.

BACKGROUND

1. Field

One or more embodiments relate to a substrate processing apparatus, and more particularly, to a substrate processing apparatus capable of removing signal interference between reactors.

2. Description of the Related Art

A substrate processing apparatus including a plurality of reactors in one chamber has the advantage of improving the precise control for an individual substrate and hourly productivity. Such a substrate processing apparatus includes a gas supply device for supplying a reaction gas to each reactor and an RF power supply device for supplying RF power to each reactor for a plasma process. The RF power supply includes an RF power generator and a matching network connected to each reactor.

For example, a substrate processing apparatus including four reactors may include four RF power generators and four matching networks connected to the reactors, respectively. RF power generated by the RF power generator during substrate processing is supplied to a reaction space of each reactor through a matching network and an RF rod. The RF power supplied into the reaction space activates gas in the reaction space, and the substrate is processed by supplying the activated gas to the substrate. However, some of the RF power may not be supplied into the reaction space, but may leak through another portion of the reactor, causing RF interference to affect other adjacent reactors. In other words, interference noise occurs in a peak-to-peak voltage (Vpp) of the supplied RF power. As a result, the uniformity of plasma generated in the reaction space of each reactor and the uniformity of the process are deteriorated. This problem is also mentioned in Korea Patent Publication No. 10-2009-0086790.

SUMMARY

One or more embodiments include a substrate processing apparatus capable of preventing unstable mismatching due to RF frequency interference during reaction in a chamber equipped with a plurality of reactors.

One or more embodiments include a substrate processing apparatus capable of stably maintaining a peak-to-peak voltage (Vpp) of power without frequency interference from adjacent reactors.

One or more embodiments include a substrate processing apparatus capable of achieving a stable plasma process by blocking frequency interference of power (especially RF power) supplied to a reactor.

Additional aspects will be set forth in part in the description which follows and, in part, will be apparent from the description, or may be learned by practice of the presented embodiments of the disclosure.

According to one or more embodiments, a substrate processing apparatus includes a first reactor, a second reactor adjacent to the first reactor, and a power generator configured to supply first power to the first reactor and supply second power to the second reactor, wherein the power generator may be further configured to synchronize phases of the first power and the second power.

According to an example of the substrate processing apparatus, the power generator may include a signal generator configured to generate a first signal and a second signal that are phase synchronized, a first power generating portion configured to generate the first power based on the first signal, and a second power generating portion configured to generate the second power based on the second signal.

According to another example of the substrate processing apparatus, the first power generating portion and the second power generating portion may be arranged symmetrically with respect to the signal generator.

According to another example of the substrate processing apparatus, the substrate processing apparatus may further include a first power transmission line connecting the signal generator to the first power generating portion, and a second power transmission line connecting the signal generator to the second power generating portion, wherein a length of the first power transmission line and a length of the second power transmission line may be the same.

According to another example of the substrate processing apparatus, the signal generator may include a splitter configured to generate a first RF signal and a second RF signal from a single RF signal, wherein the phase-synchronized first signal and the second signal may be generated by adjusting a phase of at least one of the first RF signal and the second RF signal.

According to another example of the substrate processing apparatus, the substrate processing apparatus may further include a comparator configured to compare a first phase of the first RF signal with a second phase of the second RF signal, and the splitter may be further configured to adjust the phase of at least one of the first RF signal and the second RF signal based on a comparison result of the comparator.

According to another example of the substrate processing apparatus, at least one of the first power generating portion and the second power generating portion may include at least one amplifier configured to amplify a signal output from the signal generator to output an amplified signal.

According to another example of the substrate processing apparatus, a phase of a signal output from the signal generator may be compared with a phase of the amplified signal, and the phase of the amplified signal may be adjusted according to a comparison result.

According to another example of the substrate processing apparatus, at least one of the first power generating portion and the second power generating portion may include a first amplifier configured to amplify a signal output from the signal generator and output a first amplified signal, a second amplifier configured to amplify a signal output from the signal generator and output a second amplified signal, and a combiner configured to combine the first amplified signal and the second amplified signal to generate an output signal.

According to another example of the substrate processing apparatus, the substrate processing apparatus may further include a controller configured to compare a phase of a signal output from the signal generator with a phase of an output signal amplified by the amplifier and to transmit a comparison result to the combiner.

According to another example of the substrate processing apparatus, the combiner may be configured to receive the comparison result from the controller to change a phase of at least one of the first amplified signal and the second amplified signal.

According to another example of the substrate processing apparatus, the combiner may be configured to receive the comparison result from the controller to change a phase of the output signal.

According to another example of the substrate processing apparatus, the substrate processing apparatus may further include a controller configured to compare the output signal with a target power value and transmit a comparison result to at least one of the first amplifier and the second amplifier.

According to another example of the substrate processing apparatus, at least one of the first amplifier and the second amplifier may be further configured to receive the comparison result from the controller and adjust a gain.

According to another example of the substrate processing apparatus, the substrate processing apparatus may further include a first matching network connected between the power generator and the first reactor, and a second matching network connected between the power generator and the second reactor, wherein the first matching network and the second matching network may be arranged symmetrically with respect to the power generator.

According to another example of the substrate processing apparatus, the substrate processing apparatus may further include a first power supply line connecting the power generator to the first matching network, and a second power supply line connecting the power generator to the second matching network, wherein a length of the first power supply line and a length of the second power supply line may be the same.

According to another example of the substrate processing apparatus, the first reactor may include a first processing unit and a first substrate support unit, the second reactor may include a second processing unit and a second substrate support unit, and the substrate processing apparatus may further include a support portion configured to support at least a portion of the first reactor and at least a portion of the second reactor. The support portion may be capacitively coupled with at least one of the first processing unit and the first substrate support unit, and may also be capacitively coupled with at least one of the second processing unit and the second substrate support unit.

According to another example of the substrate processing apparatus, each of the first substrate support unit and the second substrate support unit may include a ceramic heating block.

According to one or more embodiments, a substrate processing apparatus includes a power generator, a plurality of matching networks arranged symmetrically with respect to the power generator, a plurality of reactors connected to the plurality of matching networks, and a plurality of power supply lines connecting the plurality of matching networks to the power generator and having the same length as each other, wherein the power generator is configured to output a plurality of phase-synchronized powers to the plurality of matching networks, and the plurality of phase-synchronized powers may be transmitted to the plurality of reactors in a phase-synchronized manner through the plurality of power supply lines and the plurality of matching networks.

According to one or more embodiments, a substrate processing apparatus includes a single signal generator configured to output a single signal, a splitter configured to generate a first signal and a second signal from the single signal, a comparator configured to compare a first phase of the first signal with a second phase of the second signal, a first amplifier configured to amplify the first signal and output a first amplified signal, a second amplifier configured to amplify the first signal and output a second amplified signal, a first combiner configured to combine the first amplified signal and the second amplified signal to generate a first output signal, a third amplifier configured to amplify the second signal and output a third amplified signal, a fourth amplifier configured to amplify the second signal and output a fourth amplified signal, a second combiner configured to combine the third amplified signal and the fourth amplified signal to generate a second output signal, a first matching network configured to receive the first output signal, and a second matching network configured to receive the second output signal.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 15A and 15B are views illustrating whether interference noise (Vpp noise) occurs when RF power is transmitted to each reactor by using an existing RF power supply device or by using an RF power supply device according to embodiments of the inventive concept;

DETAILED DESCRIPTION

Figure 1:
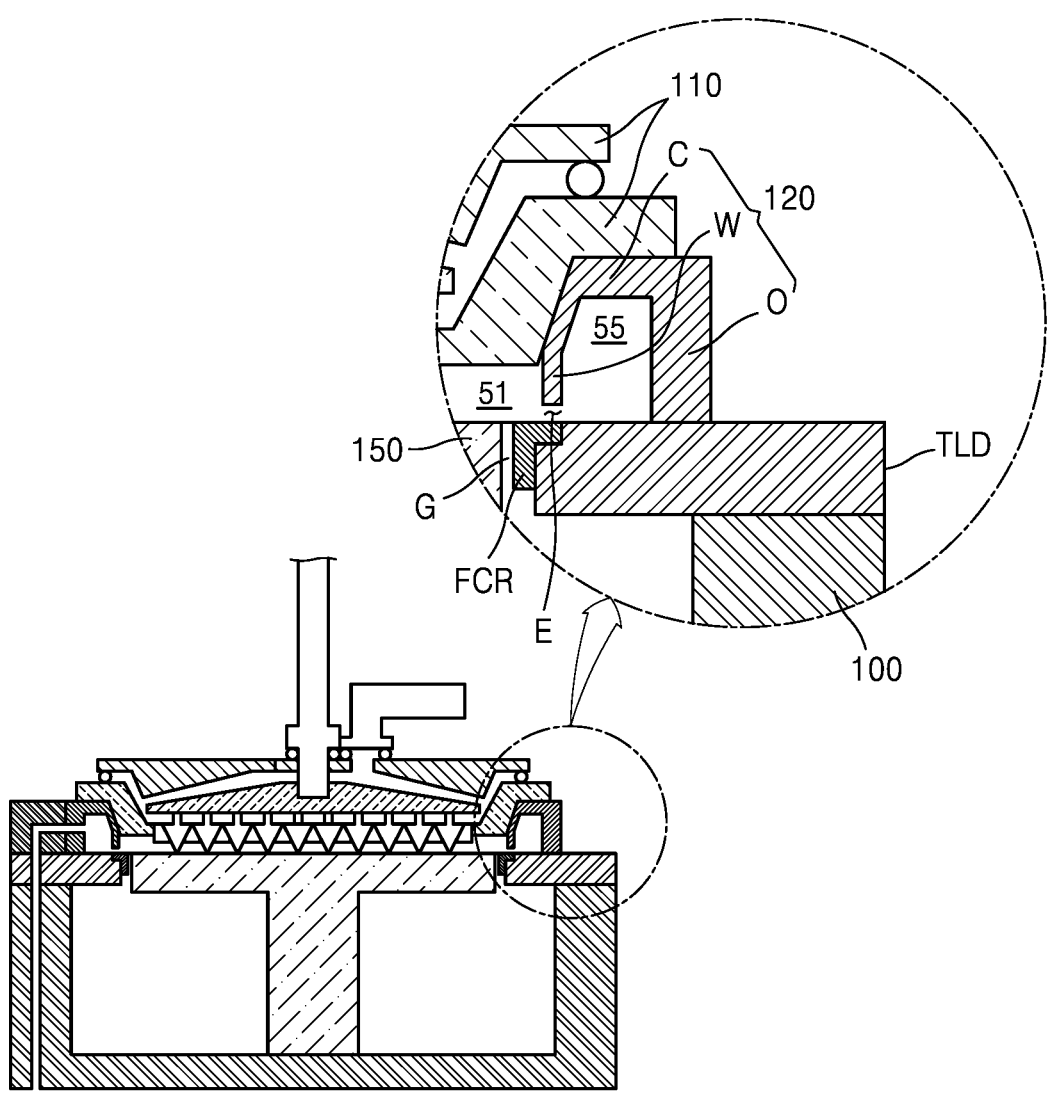
FIGS. 1 and 2 are views of a substrate processing apparatus according to embodiments of the inventive concept.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for the purpose of describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected as a result of, for example, manufacturing techniques and/or tolerances. Thus, the embodiments of the disclosure should not be construed as being limited to the particular shapes of regions illustrated herein but may include deviations in shapes that result, for example, from manufacturing processes.

Figure 2:
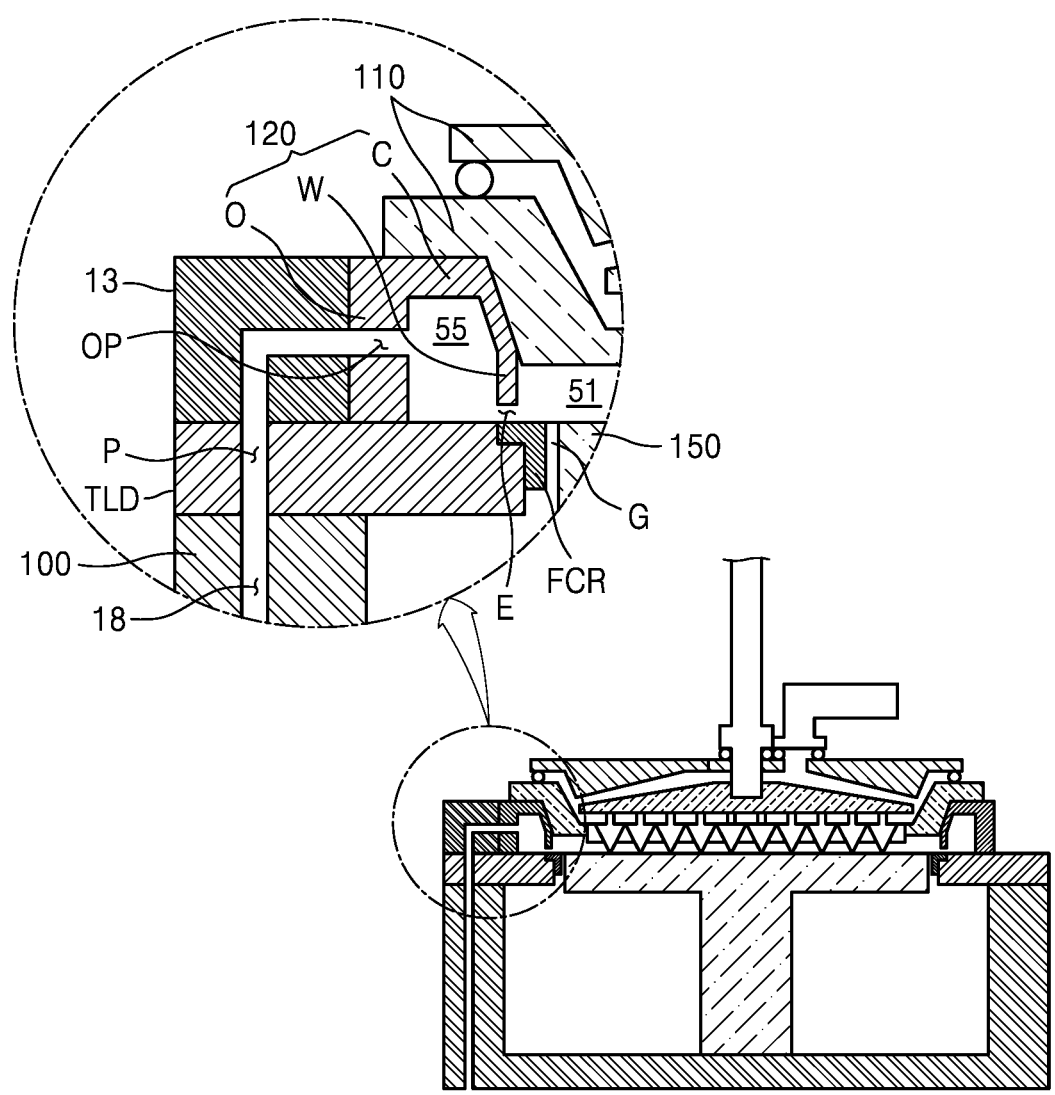

FIGS. 1 and 2 are views of a substrate processing apparatus according to embodiments of the inventive concept. FIG. 1 shows a substrate processing apparatus and a portion (cross section of a portion where an opening of an exhaust unit 120 is not formed) of the substrate processing apparatus. FIG. 2 shows a substrate processing apparatus and another portion (cross section of a portion where an opening OP of the exhaust unit 120 is formed) of the substrate processing apparatus. The opening OP may be an exhaust port.

Referring to FIGS. 1 and 2, the substrate processing apparatus may include a plurality of reactors. Each reactor may include a partition 100, a substrate support unit 150, a processing unit 110, and an exhaust unit 120. Each reactor may include a reaction space 51 and an exhaust space 55 connected to the reaction space 51.

The partition 100 is a chamber for receiving the substrate support unit 150, which may also be referred to as a chamber body. In an embodiment, a reactor including the reaction space 51 is referred to as an inner chamber, and the entire structure of the substrate processing apparatus surrounding a plurality of reactors (e.g., four reactors, see FIG. 9) may be referred to as an outer chamber. An exhaust line 18 may be provided in the partition 100. In some embodiments, the exhaust line 18 may be formed to extend along the inside of a side wall of the partition 100. In an embodiment, the substrate processing apparatus includes a first surface and a second surface adjacent to the first surface, and the exhaust line 18 may extend along an edge between the first surface and the second surface. In additional embodiments, the exhaust line 18 may be formed to extend along the inside of a lower wall of the partition 100.

The processing unit 110 may be located above the substrate support unit 150 configured to support a substrate. The reaction space 51 may be defined between the substrate support unit 150 and the processing unit 110. The processing unit 110 may serve as a first lid that defines an upper surface of the reaction space 51. In other words, the first lid above the substrate support unit may include at least one processing unit 110.

The processing unit 110 may include members that perform appropriate functions depending on a function of the substrate processing apparatus. For example, when a substrate processing apparatus performs a deposition function, the processing unit 110 may include a reactant supplier (e.g., a showerhead assembly). In another embodiment, when the reactor performs a polishing function, the processing unit 110 may include a polishing pad.

The processing unit 110 may be a conductor and may be used as an electrode for generating plasma. That is, the processing unit 110 may serve as an electrode for generating plasma. The processing unit 110 in this manner (the manner in which the processing unit 110 is used as an electrode) is hereinafter referred to as a gas supply electrode.

The substrate support unit 150 may be configured to provide an area where an object to be processed (not shown) such as a semiconductor or a display substrate is seated. The substrate support unit 150 may be supported by a support (not shown) capable of up and down and rotational movement. Further, the substrate support unit 150 may be a conductor and may be used as an electrode for generating plasma (i.e., an opposite electrode of a gas supply electrode).

The exhaust unit 120 may be located between the processing unit 110 and a support portion TLD. The exhaust unit 120 may extend to surround the reaction space 51. Gas in the reaction space 51 may be exhausted to an exhaust port 13 through the exhaust unit 120.

In an embodiment, the exhaust unit 120 may serve as a second lid that defines a side surface of the reaction space 51. The second lid including the exhaust unit 120 may include the exhaust space 55 connected to the reaction space

51. Therefore, the exhaust unit 120 may provide the exhaust space 55. Further, the exhaust unit 120 may provide a space in which the processing unit 110 is received. When the processing unit 110 is received in the space, the processing unit 110 may be in contact with the exhaust unit 120.

The exhaust unit 120 may include a partition wall W between the reaction space 51 and the exhaust space 55. A first surface (e.g., an outer surface) of the partition wall W may define the reaction space 51 and a second surface of the partition wall W (i.e., an inner surface as a surface facing the first surface) may define the exhaust space 55. For example, the reaction space 51 may be defined by the first surface of the partition wall W, an upper surface of the substrate support unit 150, and a lower surface of the processing unit 110 which is the first lid. In other words, a side of the reaction space 51 may be defined by the partition wall W of the exhaust unit 120.

The exhaust unit 120 may provide a portion of a space for the object to be processed. For example, when the substrate processing apparatus performs a deposition function, the reaction space 51 for deposition may be defined by the exhaust unit 120. Further, the exhaust space 55 may be defined inside the exhaust unit 120. The reaction space 51 may be connected to the exhaust port 13 through the exhaust space 55 of the exhaust unit 120. In more detail, gas in the reaction space 51 may be exhausted to the exhaust port 13 through a gap E, the exhaust space 55, and the opening OP.

In an example, the exhaust unit 120 may include a connecting wall C and the outer wall O extending from the partition wall W. The outer wall O of the exhaust unit 120 is disposed in parallel with the partition wall W and may contact the support portion TLD. The opening OP may be formed in the outer wall O, and the exhaust unit 120 and the exhaust port 13 may be connected to each other through the opening OP. The connecting wall C of the exhaust unit 120 may extend to connect the partition wall W to the outer wall O. The connecting wall C may provide a contact surface with the processing unit 110. The processing unit 110, which is the first lid, and the exhaust unit 120, which is the second lid, may be in contact with each other by the contact surface.

The support portion TLD may contact the exhaust unit 120 to support the processing unit 110 and the exhaust unit 120. The support portion TLD may be supported by the partition 100. As described above, the support portion TLD may serve as a top lid which is supported by the partition 100 to cover an outer chamber while supporting the processing unit 110 as the first lid and the exhaust unit 120 as the second lid.

The support portion TLD may be located between the partition 100 and the exhaust port 13. The support portion TLD may include a path P connecting the exhaust port 13 to the exhaust line 18 of the partition 100. In an embodiment, a cross-sectional area of the path P and a cross-sectional area of the exhaust line 18 may be substantially the same. For example, when the path P and the exhaust line 18 are formed in a circular shape, a diameter of the path P may be the same as that of the exhaust line 18. In additional embodiments, a sealing member (not shown) may be disposed between the support portion TLD and the partition. The sealing member may extend along a circumference of the path P or the exhaust line 18, thereby preventing leakage of gas exhausting from the path P to the exhaust line 18.

The support portion TLD may be located between the partition 100 and a lid (e.g., the second lid including the exhaust unit 120). A gas flow control ring FCR may be on the support portion TLD. Further, the gas flow control ring FCR may be located between the support portion TLD and the substrate support unit 150. The gas flow control ring FCR may be slidably on the support portion TLD. The gas flow control ring FCR may be apart from the substrate support unit 150 to form a gap G and a pressure balance between the reaction space 51 and an inner space of the outer chamber may be controlled by adjusting the gap G.

The partition wall W may provide a gap E connecting the reaction space 51 to the exhaust space 55. For example, the gap E may be formed between the exhaust unit 120 and the gas flow control ring FCR. The gap E may be a channel between the reaction space 51 and the exhaust space 55. Therefore, the reaction space 51 and the exhaust space 55 may communicate with each other through the channel.

The exhaust port 13 may include a channel extending in a first direction towards the exhaust unit 120 and a second direction different from the first direction. In an example embodiment, the exhaust port 13 may have an L-shaped or L-like shaped channel formed therein, so that gas in the exhaust space 55 may flow laterally towards the exhaust port 13 and may be exhausted downward. In another example, the gas in the exhaust space 55 may flow laterally and may be exhausted upward. The gas exhausted through the exhaust port 13 may be transmitted to an exhaust pump (not shown) through the exhaust line 18, and the gas may be exhausted to the outside by the exhaust pump (not shown).

Figure 3:
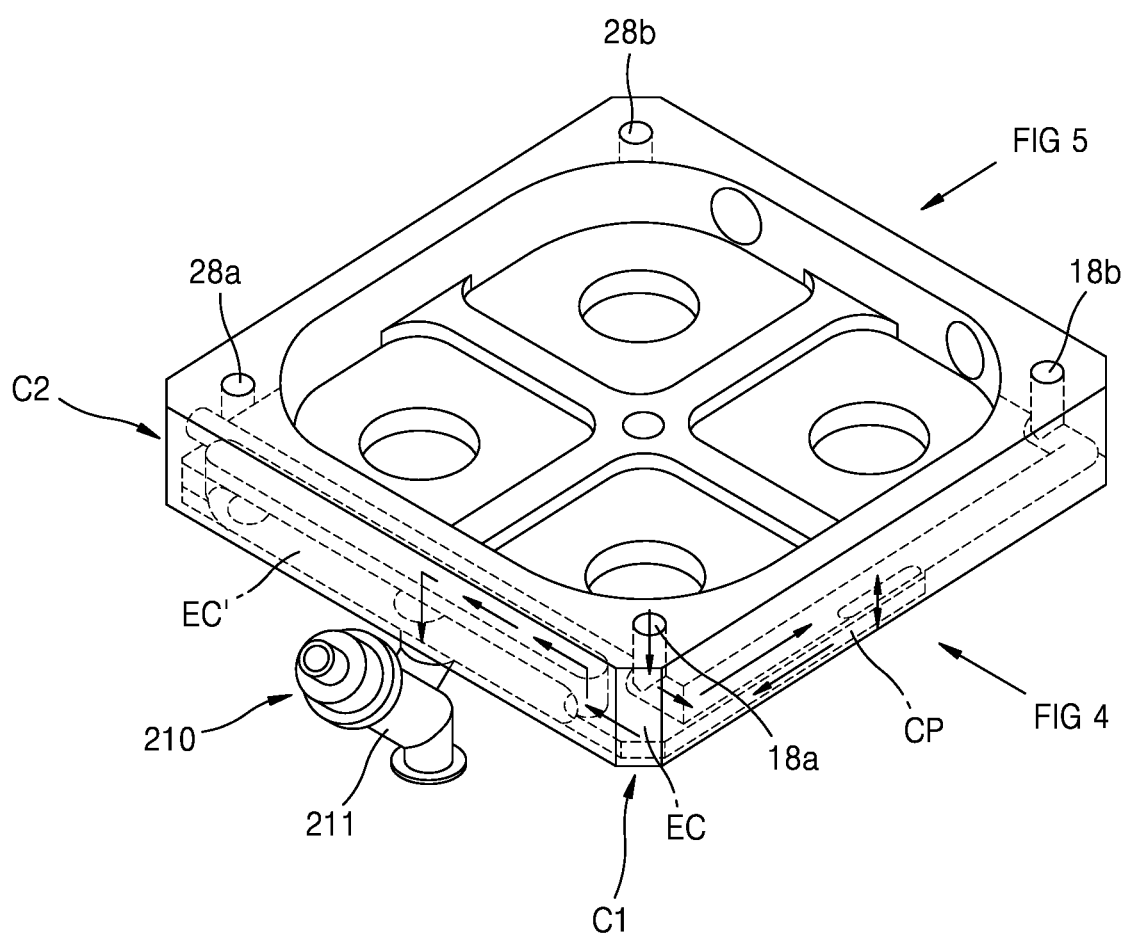
FIGS. 3 to 5 are views of a substrate processing apparatus according to embodiments of the inventive concept.
Figure 4:
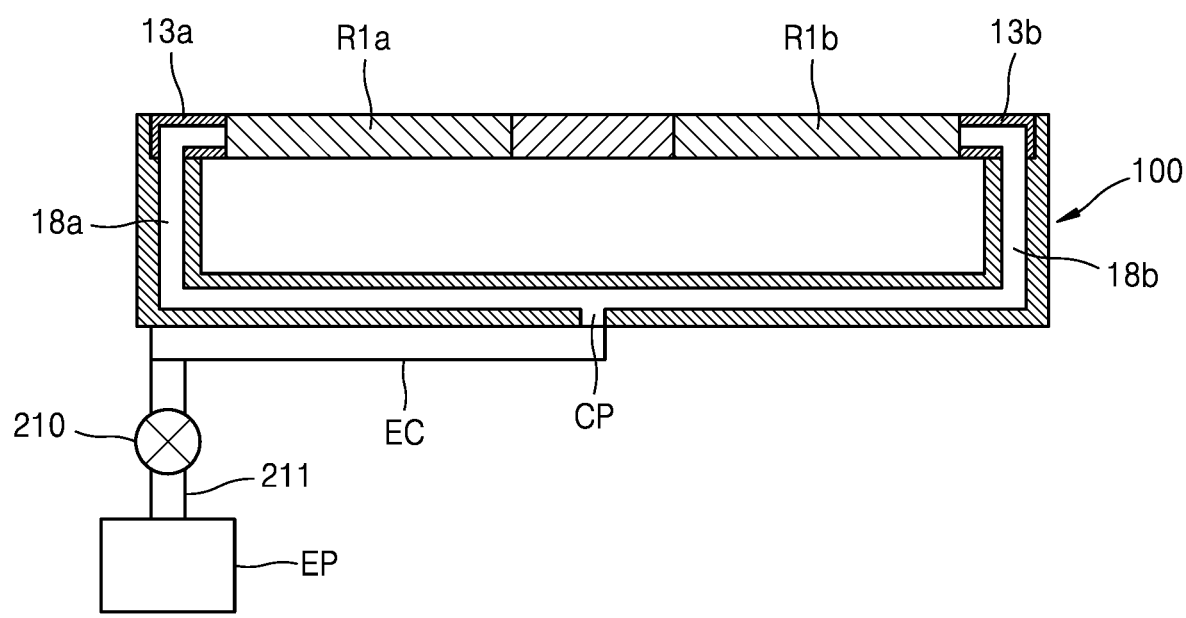
Figure 5:
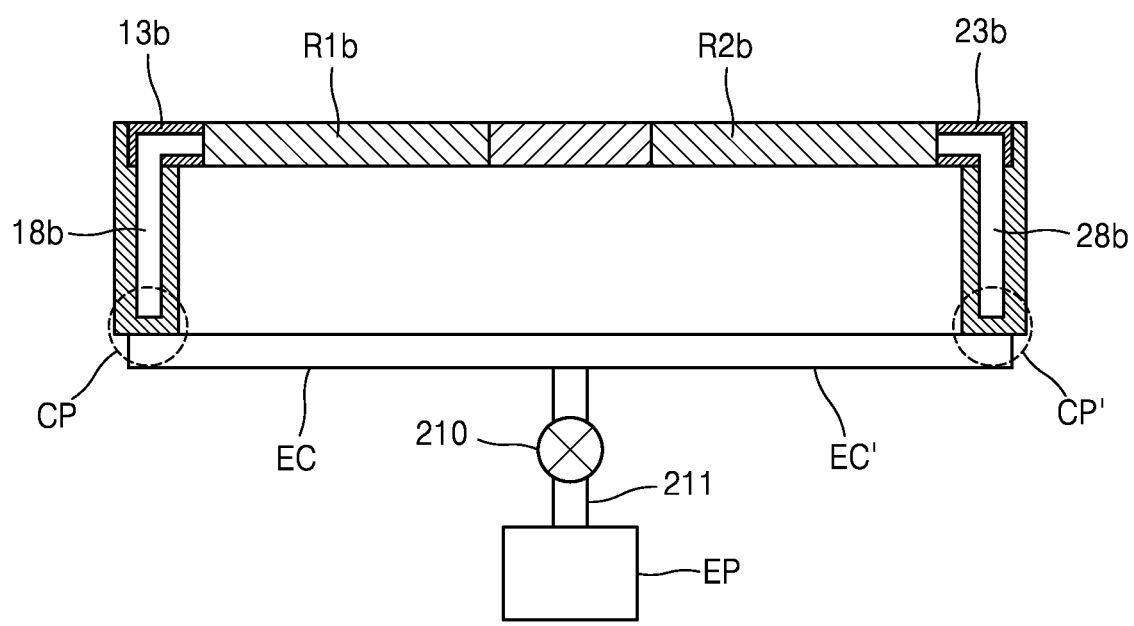

FIGS. 3 to 5 are views of a substrate processing apparatus according to embodiments of the inventive concept. In more detail, FIG. 3 shows a portion (e.g., exhaust lines 18 and 28, a connection port CP, an external path EC connected to an external pump, etc.) of the substrate processing apparatus excluding a lid (i.e., a processing unit and an exhaust unit) and an exhaust port. FIG. 4 is a view of FIG. 3 viewed from a first direction, and FIG. 5 is a view of FIG. 3 viewed from a second direction. The substrate processing apparatus according to the embodiments may be a variation of the substrate processing apparatus according to the above-described embodiments. Hereinafter, repeated descriptions of the embodiments will not be given herein.

Referring to FIGS. 3 to 5, exhaust lines 18 and 28 are formed in the partition 100. The exhaust lines 18 and 28 are connected to the external path EC through the connection port CP and the external path EC is connected to a main exhaust path 211. Therefore, gas in a reaction space is exhausted to an exhaust pump EP via exhaust ports 13 and 23, the exhaust lines 18 and 28, the external path EC, and the main exhaust path 211. Although not shown in the drawings, each of the exhaust ports 13 and 23 is provided with a flow controller according to embodiments of the inventive concept.

As shown in FIG. 4, two reactors R1*a* and R1*b* in a first direction use internal exhaust lines 18*a* and 18*b*, and the remaining two reactors in a direction opposite to the first direction use other internal exhaust lines 28*a* and 28*b*. The two inner exhaust lines 18 and 28 are connected to external paths EC and EC' through connection ports CP and CP', respectively. The external paths EC and EC' may be implemented in one configuration or in a plurality of configurations.

As a result, it can be seen that the four reactors use at least one of external paths EC and EC', the main exhaust path 211, and the exhaust pump EP. An isolation valve 210 may be added to the main exhaust path 211. Therefore, the exhaust pump EP may be protected from the outside atmosphere by the isolation valve 210 during a maintenance period. Further, a pressure control valve (e.g., a throttle valve) may be added to the main exhaust path 211. The external path EC may be fixed so as not to move in close contact with a lower surface of the partition 100 of an outer chamber. In an alternative embodiment, the two inner exhaust lines 18 and 28 may be connected to each other within a bottom wall of the partition 100 of the outer chamber and directly connected to the main exhaust path 211, without the external path EC.

Referring again to FIG. 3, the first external path EC connected to the first connection port CP may extend below the partition 100 towards a first corner portion C1 of the outer chamber. In addition, the second external path EC' connected to the second connection port CP' (not shown) may extend below the partition 100 towards a second corner portion C2 of the outer chamber. The exhaust pump EP may be arranged on one surface of the substrate processing apparatus, for example, corresponding to the center between the first corner portion C1 and the second corner portion C2. The first external path EC may extend from the portion extending to the first corner portion C1 to the exhaust pump EP. Also, the second external path EC' may extend from the portion extending to the second corner portion C2 to the exhaust pump EP.

Figure 6:
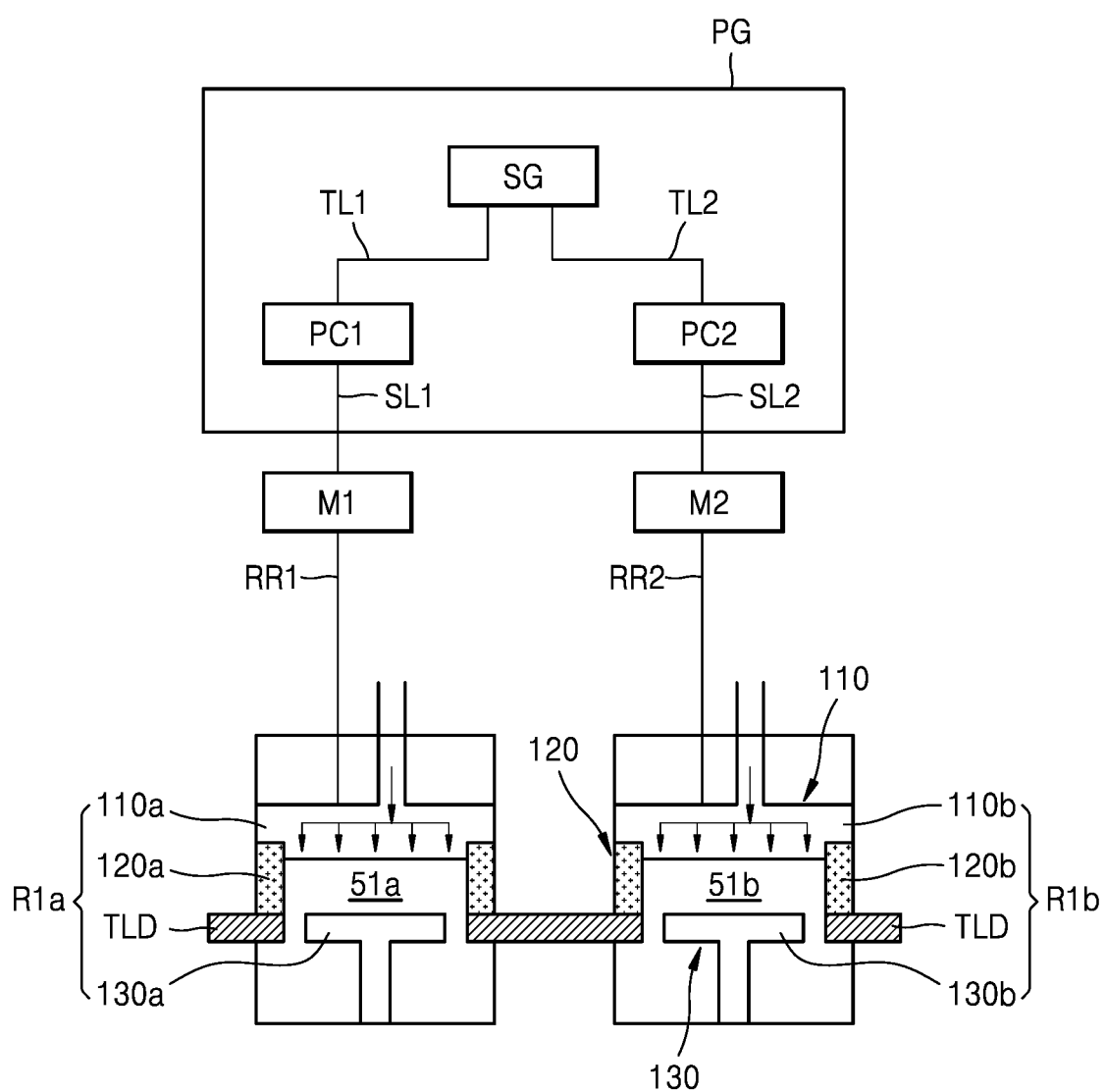
FIG. 6 is a view of a substrate processing apparatus according to embodiments of the inventive concept.

FIG. 6 is a view of a substrate processing apparatus according to embodiments of the inventive concept. The substrate processing apparatus according to the embodiments may be a variation of the substrate processing apparatus according to the above-described embodiments. Hereinafter, repeated descriptions of the embodiments will not be given herein.

The substrate processing apparatus is a multiple reactor chamber and may include a power generator, a plurality of matching networks arranged symmetrically with respect to the power generator, and a plurality of reactors connected to the plurality of matching networks. Although only two reactors are shown in FIG. 6, this is only an example, and the substrate processing apparatus may include three or more reactors. Hereinafter, a substrate processing apparatus will be described with reference to FIG. 6 on the premise that the substrate processing apparatus includes two reactors (i.e., the first reactor R1a and the second reactor R1b).

Referring to FIG. 6, the substrate processing apparatus may include the first reactor R1a, the second reactor R1b, and a power generator PG. In addition, the substrate processing apparatus may further include a first matching network M1 and a second matching network M2.

The first reactor R1a and the second reactor R1b may be arranged adjacent to each other. Each reactor may include a substrate support unit 130, the processing unit 110, and the exhaust unit 120 as described above. Each reactor may include the reaction space 51 and an exhaust space (not shown) connected with the reaction space 51, and the support portion TLD may support at least a portion of the first reactor R1a and at least a portion of the second reactor R1b. In addition, the substrate support unit 130 may be apart from the support portion TLD. Hereinafter, a duplicate description of the reactor will not be given herein.

The first reactor R1a and the second reactor R1b may be open reactors. Such an open reactor keeps a reaction space open rather than closed when the reaction space is formed between the processing unit 110 and the substrate support unit 130. That is, the open reactor is the opposite of a closed reactor in which a substrate support unit and a partition wall contact to form a closed reaction space. As will be described later below, in the case of an open reactor, since a support portion (or partition) and a substrate support unit are apart from each other, capacitive coupling problems between reactors and the resulting signal interference problems may occur during a high frequency plasma process.

The power generator PG may be configured to supply power to the first reactor R1a and the second reactor R1b. The power generator PG may be configured to output a plurality of phase-synchronized powers. For example, the power generator PG may be configured to supply first power to the first reactor R1a and to supply second power to the second reactor R1b. The power generator PG may be further configured to synchronize phases of the first power and the second power. Thus, the power generated by the power generator PG may be transmitted to a plurality of reactors in a phase synchronized manner.

The power generator PG may include a signal generator SG, a first power generating portion PC1, and a second power generating portion PC2 for phase-synchronized power transmission. The signal generator SG may be configured to generate a phase-synchronized signal by receiving an external power source. The phase-synchronized signal may include, for example, a first signal and a second signal. The signal generator SG may be connected to the first power generating portion PC1 and the second power generating portion PC2. The signal generator SG may also include a splitter configured to generate a plurality of RF signals from a single signal and a comparator configured to compare phases of the plurality of RF signals. A more detailed description of the splitter and the comparator will be described later with reference to FIG. 7.

A phase-synchronized signal output by the signal generator SG may be transmitted to the first power generating portion PC1 and the second power generating portion PC2. The first power generating portion PC1 may be configured to generate first power based on a phase-synchronized first signal. The second power generating portion PC2 may be configured to generate second power based on a phase-synchronized second signal. As described above, since the first signal and the second signal have an identical phase, the first power and the second power generated by the first power generating portion PC1 and the second power generating portion PC2 may also have an identical phase.

The first power generating portion PC1 and the second power generating portion PC2 may be arranged symmetrically with respect to the signal generator SG such that the first power and the second power of the same phase may be supplied. Further, a first power transmission line TL1 connecting the signal generator SG to the first power generating portion PC1, and a second power transmission line TL2 connecting the signal generator SG to the second power generating portion PC2 may be formed to have the same length (and the same impedance) as each other. Therefore, phase-synchronized signals (i.e., the first signal and the second signal) output from the signal generator SG may be transmitted to the first power generating portion PC1 and the second power generating portion PC2, through the first power transmission line TL1 and the second power transmission line TL2 respectively, while maintaining the same phase with each other without phase shift.

The first power generating portion PC1 may include at least one amplifier configured to amplify the first signal output from the signal generator SG to output an amplified signal. The amplified signal amplified by the amplifier of the first power generating portion PC1 may have a first power value. First power generated by the first power generating portion PC1 described above may correspond to the amplified signal having the first power value.

Similarly, the second power generating portion PC2 may include at least one amplifier configured to amplify the second signal output from the signal generator SG to output an amplified signal. The amplified signal amplified by the amplifier of the second power generating portion PC2 may have a second power value. Second power generated by the second power generating portion PC2 described above may correspond to the amplified signal having the second power value.

A phase of an amplified signal output from the at least one amplifier (i.e., an amplifier of the first power generating portion PC1 and/or an amplifier of the second power generating portion PC2) may be compared with a phase of a signal output from the signal generator SG. The phase of the amplified signal may be adjusted based on this comparison operation. For example, when the phase of the amplified signal is slower than the phase of the signal output from the signal generator SG, the phase of the amplified signal may be adjusted to be faster. On the contrary, when the phase of the amplified signal is faster than the phase of the signal output from the signal generator SG, the phase of the amplified signal may be adjusted to be slow.

In an alternative embodiment, the first power generating portion PC1 or the second power generating portion PC2 (or both) may include a plurality of amplifiers. For example, the plurality of amplifiers may be configured to amplify signals of different bands. As a specific example, the first power generating portion PC1 and/or the second power generating portion PC2 may include a first amplifier configured to amplify a signal output from the signal generator SG and output a first amplified signal and a second amplifier configured to amplify a signal output from the signal generator SG and output a second amplified signal. In addition, the first power generating portion PC1 and/or the second power generating portion PC2 may further include a combiner configured to combine the first amplified signal and the second amplified signal to generate an output signal. The output signal may correspond to the aforementioned first power and/or second power. Specific configurations related to the first amplifier, the second amplifier, and the combiner will be described in detail later with reference to FIG. 8.

The first matching network M1 may be configured to match power impedance of the power generator PG and plasma impedance of the first reactor R1a for power transmission optimization. For example, the first matching network M1 may include at least one first variable capacitor for matching real portions and imaginary portions of the power impedance and the plasma impedance of the first reactor R1a. An output signal (i.e., first power) output from the first power generating portion PC1 may be transmitted to the first matching network M1 through a first power supply line SL1. The first power transmitted to the first matching network M1 may be transmitted to a first RF rod RR1 of the first reactor R1a.

The second matching network M2 may be configured to match power impedance of the power generator PG and plasma impedance of the second reactor R2a for power transmission optimization. For example, the second matching network M2 may include at least one second variable capacitor for matching real portions and imaginary portions of the power impedance and the plasma impedance of the second reactor R1b. An output signal (i.e., second power) output from the second power generating portion PC2 may be transmitted to the second matching network M2 through a second power supply line SL2. The second power transmitted to the second matching network M2 may be transmitted to a second RF rod RR2 of the second reactor R1b.

The first matching network M1 and the second matching network M2 may be arranged symmetrically with respect to the power generator PG such that first power and the second power of an identical phase may be supplied. Furthermore, the first power supply line SL1 connecting the power generator PG and the first matching network M1 and the second power supply line SL2 connecting the power generator PG and the second matching network M2 may be formed to have the same length (and the same impedance) as each other. Therefore, the first power and the second power that are phase synchronized output from the power generator PG may be transmitted to the first matching network M1 and second matching network M2, through the first power supply line SL1 and the second power supply line SL2 respectively, while maintaining the same phase with each other without phase shift.

According to embodiments of the inventive concept, as described above, since power supplied to a plurality of reactors is phase-synchronized, frequency interference that may occur between the reactors and thus a matching error may be prevented. Thus, a stable plasma process may be achieved.

Open reactors require a stable plasma process. In an open reactor in which multiple reactors share one support portion TLD, the support portion TLD may be capacitively coupled with at least one of a first processing unit 110a and a first substrate support unit 130a. For example, a first exhaust unit 120a, which is an insulator, may be disposed between the first processing unit 110a and the support portion TLD, so that a high-frequency plasma signal transmitted to the first processing unit 110a may be transmitted to the support portion TLD through the exhaust unit 120a. In addition, the first substrate support unit 130a and the support portion TLD may be apart from each other or a first flow control ring (not shown) may be therebetween, and thus, a high frequency plasma signal transmitted from the first processing unit 110a to the first substrate support unit 130a may be transmitted to the support portion TLD through the space and/or the first flow control ring. The high frequency plasma signal transmitted to the support portion TLD is transmitted to the second reactor R1b and may cause RF interference.

Similarly, the support portion TLD may be capacitively coupled with at least one of a second processing unit 110b and a second substrate support unit 130b. For example, a second exhaust unit 120b, which is an insulator, may be between the second processing unit 110b and the support portion TLD, so that a high-frequency plasma signal transmitted to the second processing unit 110b may be transmitted to the support portion TLD through the second exhaust unit 120b. In addition, the second substrate support unit 130b and the support portion TLD may be apart from each other or a second flow control ring (not shown) may be therebetween, and thus, a high frequency plasma signal transmitted from the second processing unit 110b to the second substrate support unit 130b may be transmitted to the support portion TLD through the space and/or the second flow control ring. The high frequency plasma signal transmitted to the support portion TLD is transmitted to the first reactor R1a and may cause RF interference.

In a high temperature process using a high temperature of 300 degrees Celsius or more, since the stress due to a temperature change of a substrate support unit increases significantly, the substrate support unit needs to include a ceramic heater whose surface material is an insulator. On the other hand, since the volume of the substrate support unit changes during the high temperature process, it is necessary to introduce an open reactor in which a substrate support unit and a support portion (or partition) are spaced apart from each other.

When a high frequency plasma process of 60 MHz or more is used in such a high temperature process, signal interference problems are caused by capacitive coupling between components of a substrate processing apparatus. That is, in a high temperature process, an open reactor is introduced and thus a support portion is spaced apart from a processing unit and/or a substrate support unit. A general electrical signal is not transmitted through such a space, but in the case of a high frequency electrical signal, capacitive coupling may be formed in the space and thus signal transmission may occur.

According to embodiments of the inventive concept, under at least one of the above-described high temperature process, the high frequency plasma process, the process in which an open reactor is introduced, and/or the process employing a ceramic heating block, signal interference (e.g., RF interference) that may occur between reactors may be removed.

Figure 7:
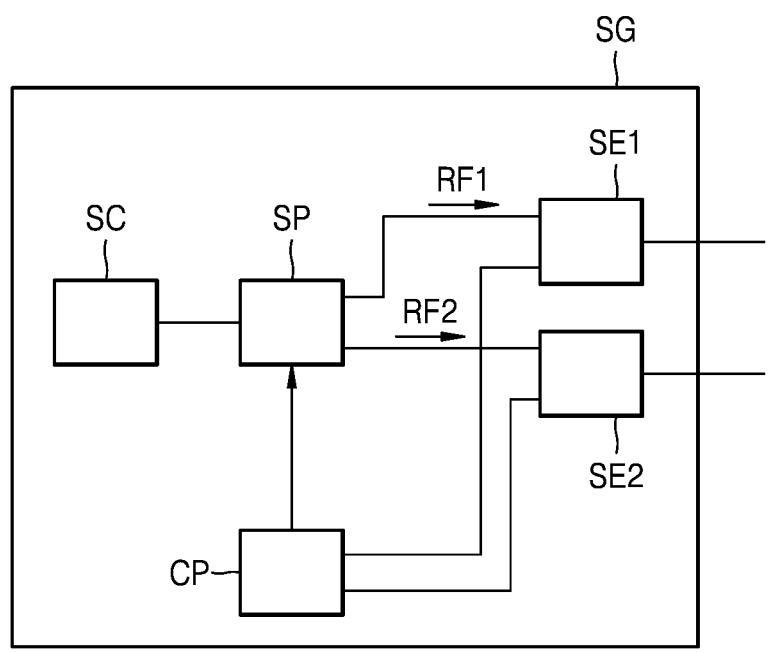
FIG. 7 is a detailed view of a signal generator of a power generator of a substrate processing apparatus according to the embodiments of FIG. 6.

FIG. 7 is a detailed view of the signal generator SG of the power generator PG of a substrate processing apparatus according to the embodiments of FIG. 6. Hereinafter, repeated descriptions of the embodiments will not be given herein.

Referring to FIG. 7, the signal generator SG may include a single signal generator SC, a splitter SP, a first sensor SE1, a second sensor SE2, and a comparator CP.

The single signal generator SC may be configured to generate a single signal based on a power source applied from the outside. For example, the single signal may be a high frequency signal (e.g., an RF signal) having a frequency of 60 MHz or more.

The splitter SP may be configured to divide a single signal into a plurality of signals. For example, the splitter SP may be configured to generate a first RF signal RF1 and a second RF signal RF2 from a single RF signal. In a further embodiment, the splitter SP may be configured to adjust phases of the first RF signal RF1 and the second RF signal RF2. For example, the splitter SP may receive a comparison signal from the comparator CP and adjust phases of the first RF signal RF1 and/or the second RF signal RF2 based on the comparison signal.

The comparator CP may be configured to compare the phase of the first RF signal RF1 with the phase of the second RF signal RF2. For example, the first sensor SE1 and the second sensor SE2 may be connected to an output terminal of the splitter SP. The phase of the first RF signal RF1 and the phase of the second RF signal RF2 may be detected by the first sensor SE1 and the second sensor SE2. The comparator CP may receive and compare the phases of the first RF signal RF1 and the second RF signal RF2 thus detected, and output a comparison signal indicating a comparison result to the splitter SP.

Although the splitter SP, the comparator CP, the first sensor SE1, and the second sensor SE2 are illustrated as separate components in FIG. 7, they may be implemented as integrated components. For example, a comparison function of the comparator CP may be implemented in the splitter SP. In this case, the splitter SP may perform the comparison function based on phase information detected by the first sensor SE1 and the second sensor SE2, and the phase of at least one of the first RF signal RF1 and the second RF signal RF2 may be adjusted based on a comparison result. In another example, the first sensor SE1 and the second sensor SE2 may be integrated in the comparator CP.

Figure 8:
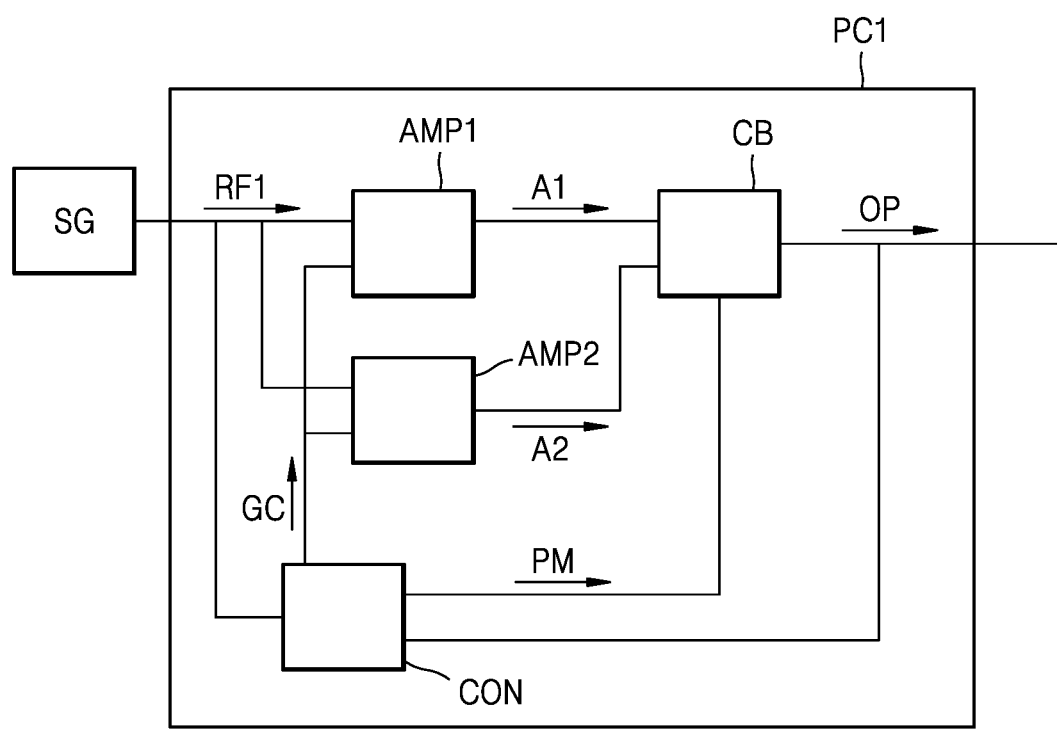
FIG. 8 is a detailed view of a power generating portion of a power generator of a substrate processing apparatus according to the embodiments of FIG. 6.

FIG. 8 is a detailed view of the power generating portion PC1 or PC2 of a power generator of a substrate processing apparatus of FIG. 6. Hereinafter, repeated descriptions of the embodiments will not be given herein.

Referring to FIG. 8, the first power generating portion PC1 (or the second power generating portion PC2, hereinafter, the first power generating portion PC1 will be described) connected to the signal generator SG may include a first amplifier AMP1, a second amplifier AMP2, a combiner CB, and a controller CON.

The first amplifier AMP1 may be configured to amplify a signal (i.e., the first RF signal RF1) output from the signal generator SG and output a first amplified signal A1. The second amplifier AMP2 may be configured to amplify the signal (i.e., the first RF signal RF1) output from the signal generator SG and output a second amplified signal A2. In some embodiments, the first amplifier AMP1 and the second amplifier AMP2 may be configured to amplify different bands of the first RF signal RF1.

The combiner CB may be configured to combine the first amplified signal A1 and the second amplified signal A2 to generate an output signal OP. In an example, the combiner CB may be configured to change a phase of at least one of the first amplified signal A1, the second amplified signal A2, and the output signal OP. A phase adjustment function of the combiner CB may be performed based on a comparison result received from the controller CON.

In more detail, in an example, the controller CON may compare the phase of the first RF signal RF1 from the signal generator SG with a phase of the output signal OP from the combiner CB. Although not shown in FIG. 8, a sensor may be connected to the output terminal of the signal generator SG for detecting the phase of the first RF signal RF1. In addition, the sensor may be connected to the output terminal of the combiner CB to detect the phase of the output signal OP. Output terminals of the sensors may be connected to the controller CON. A function of such a sensor may be implemented in the controller CON, and FIG. 8 illustrates a state in which a sensor is implemented in the controller CON.

The combiner CB may be configured to receive a comparison result from the controller CON and change a phase of at least one of the first amplified signal A1 and the second amplified signal A2. In an alternative embodiment, the combiner CB may be configured to receive a comparison result from the controller CON and change the phase of the output signal OP. For example, the controller CON may output a phase adjustment signal PM as a comparison result, and the combiner CB may perform a phase adjustment function in response to the phase adjustment signal PM.

In some embodiments, gains of the first amplifier AMP1 and the second amplifier AMP2 may be adjusted. In more detail, the controller CON may be configured to compare the output signal OP with a target power value and transmit a gain comparison result GC to the first amplifier AMP1 and the second amplifier AMP2. The first amplifier AMP1 and the second amplifier AMP2 may receive a gain comparison result GC from the controller CON and adjust a gain to output the first amplified signal A1 and the second amplified signal A2, respectively.

Although FIG. 8 has been described based on the first power generating portion PC1, the second power generating portion PC2 may also include the configuration shown in FIG. 8. For example, the second power generating portion PC2 may include a third amplifier AMP3 configured to amplify a second signal (e.g., the second RF signal RF2) from a signal generator SG and output a third amplified signal A3, a fourth amplifier AMP4 configured to amplify the second signal and output a fourth amplified signal A4, and a second combiner CB2 configured to combine the third amplified signal A3 and the fourth amplified signal A4 to generate a second output signal OP2.

Figure 9:
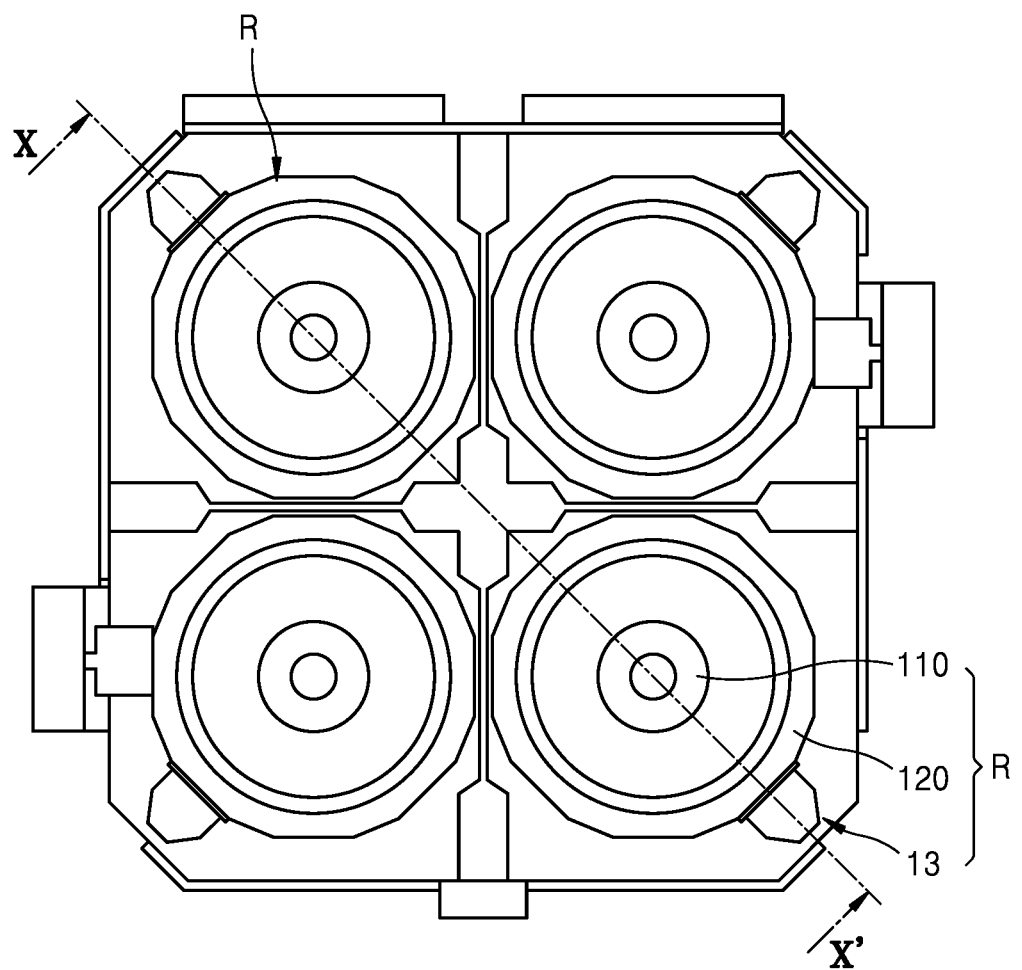
FIGS. 9 and 10 are views of a substrate processing apparatus according to embodiments of the inventive concept.
Figure 10:
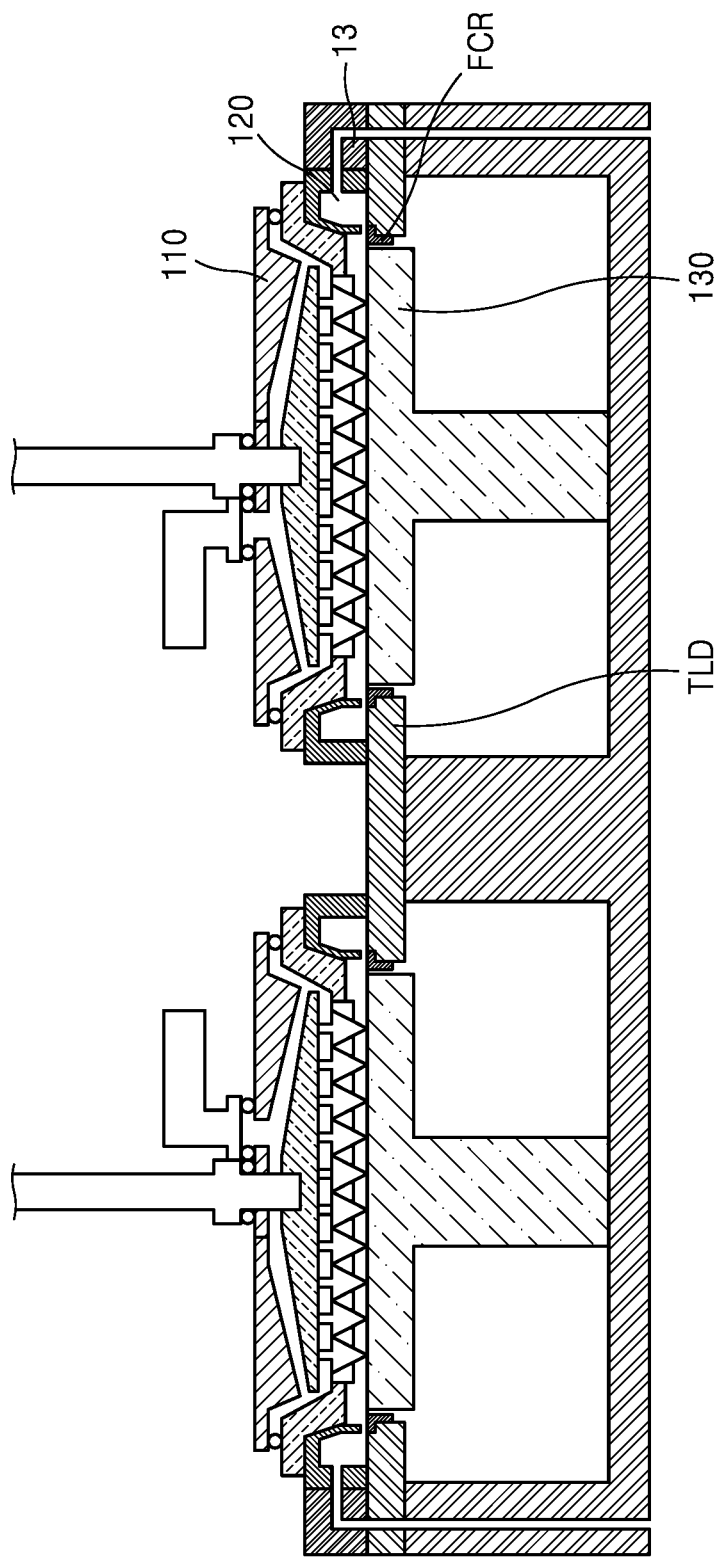

FIGS. 9 and 10 are views of a substrate processing apparatus according to embodiments of the inventive concept. The substrate processing apparatus according to the embodiments may be a variation of the substrate processing apparatus according to the above-described embodiments. Hereinafter, repeated descriptions of the embodiments will not be given herein.

Referring to FIG. 9, an upper surface of a multiple reactor chamber is shown. A plurality of reactors R are arranged in the chamber and one side of each reactor R is connected to an exhaust port 13. It can be seen from FIG. 10 that each reactor R is connected to each exhaust port 13.

FIG. 10 is a cross-sectional view of the multiple reactor chamber taken along line X-X' of FIG. 9. A reaction space of the reactor R may be defined as a space surrounded by the exhaust unit 120 functioning as a lid and having an exhaust duct, the support portion TLD therebelow, the gas flow control ring FCR on the support portion TLD, the processing unit 110 on an inner space surrounded by the exhaust unit 120, and the substrate support unit 130 arranged to face the processing unit 110. The substrate support unit 130 may include a heating device (e.g., an insulating heating block, such as a ceramic heating block).

The substrate support unit 130 and the support portion TLD may be apart from each other to form a gap. The gas flow control ring FCR may be disposed between the substrate support unit 130 and the support portion TLD. In addition, the exhaust unit 120 may be disposed between the processing unit 110 and the support portion TLD. The gas flow control ring FCR and the exhaust unit 120 may include an insulating material. Thus, capacitive coupling may be formed between the substrate support unit 130 and the support portion TLD and between the processing unit 110 and the support portion TLD.

In a high temperature process and in a high frequency plasma process of 60 MHz or more, such capacitive coupling may cause signal interference problems. However, a substrate processing apparatus according to embodiments of the inventive concept allows power to be supplied to a plurality of reactors in a phase-synchronized manner, instead of installing a separate power generator for each reactor to supply individual power. For example, by generating a plurality of phase-synchronized powers in one integrated power generator and configuring them to be supplied to each of the plurality of reactors in a phase-synchronized manner, the aforementioned signal interference problems may be avoided.

Figure 11A:
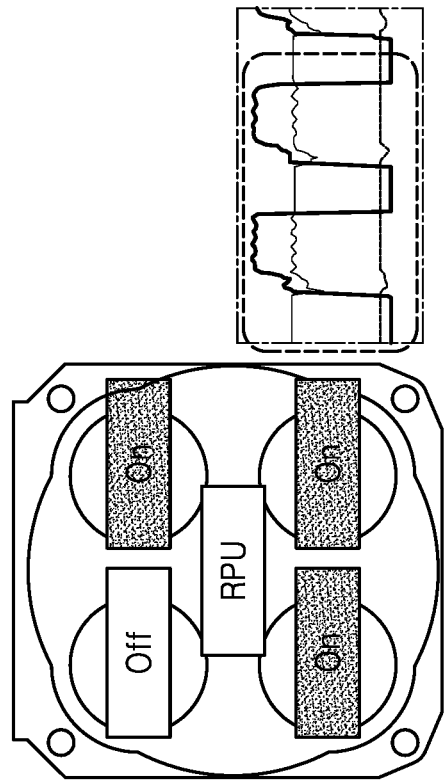
FIGS. 11A and 11B are views of a substrate processing apparatus for supplying individual power from a separate power generator installed for each reactor, and show a case where RF power is supplied to one of four reactors (FIG. 11A) and a case where RF power is supplied to three of the four reactors (FIG. 11B)

FIG. 11A illustrates a case where RF power is supplied to only one of four reactors in a substrate processing apparatus in which a separate power generator is installed for each reactor to supply individual power. As shown in FIG. 11A, the substrate processing apparatus exhibits a flat state in which no interference noise is present in a peak-to-peak voltage (Vpp) during a plasma process.

Figure 11B:
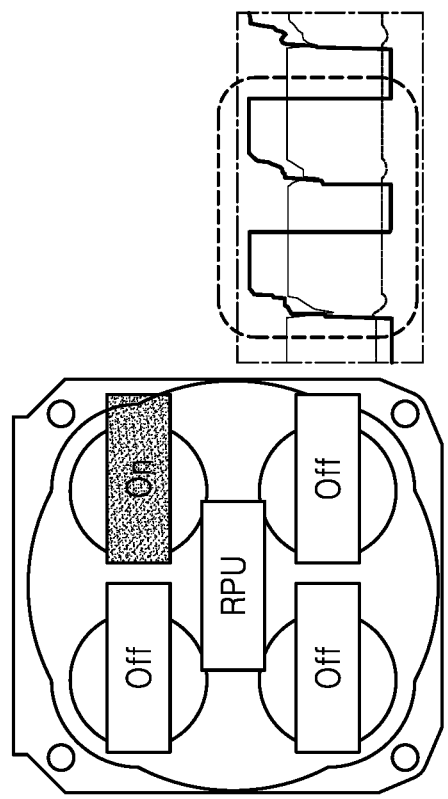

FIG. 11B illustrates a case where RF power is supplied to three of the four reactors in the substrate processing apparatus in which a separate power generator is installed for each reactor to supply individual power. As shown in FIG. 11B, it can be seen that the Vpp is not stabilized and interference noise occurs due to RF interference during the process. That is, RF forward power in one reactor is incorrectly measured as RF reflect power of the corresponding reactor in a matching network of another adjacent reactor, resulting in Vpp noise while attempting matching accordingly.

As described above, due to the RF interference generated when the RF power is supplied to each of the plurality of reactors, the reproducibility of a plasma process between the reactors is reduced. This phenomenon occurs especially in an open reactor in which there is no reactor wall and it is difficult for RF power to flow sequentially from an electrode (e.g., a shower head) to a substrate support portion (e.g., a heater), and to a ground electrode.

Figure 12:
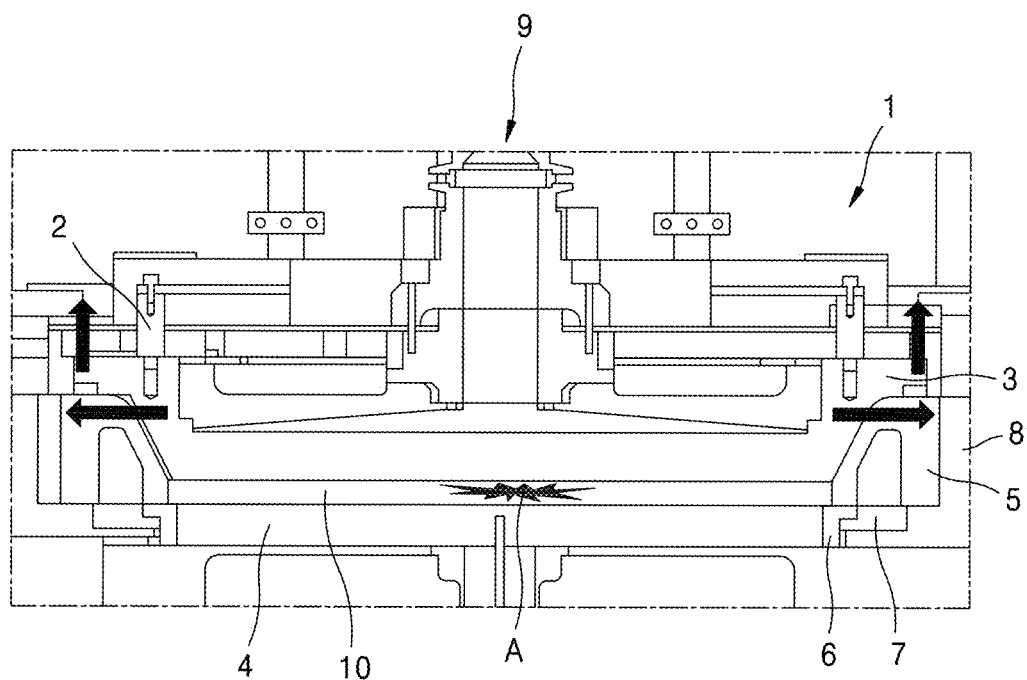
FIG. 12 is a view illustrating power leakage occurring in an open reactor.

FIG. 12 is a view illustrating power leakage occurring in such an open reactor. Referring to FIG. 12, a gas control ring 6 and a heating block 4 are apart from each other. Therefore, some RF power applied through an upper electrode 3 may leak into an adjacent reactor through an exhaust duct 5 or a top lid 8 supporting a shower head 3, instead of passing through a lower electrode 4 to a ground electrode (see arrows). In particular, when high voltage RF power is applied, RF power leakage may occur due to the exhaust duct 5 which is an insulator. This also affects a matching network of the adjacent reactor, which degrades the stability of Vpp and plasma process reproducibility.

Figure 13:
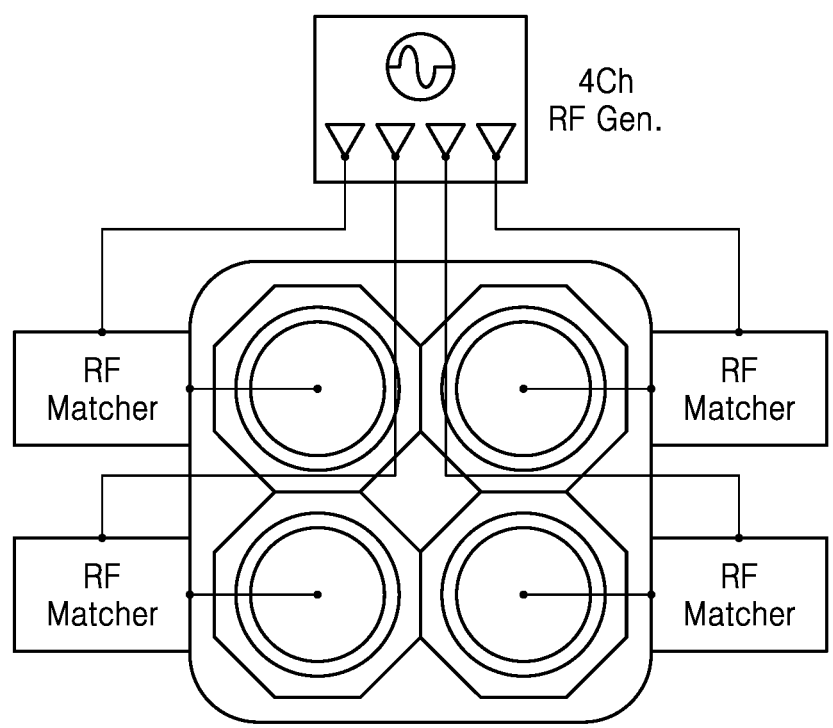
FIG. 13 is a view of a substrate processing apparatus according to embodiments of the inventive concept.

FIG. 13 is a view of a substrate processing apparatus according to embodiments of the inventive concept, the substrate processing apparatus including one RF power generator, a plurality of reactors, and matching networks corresponding thereto. For example, as illustrated in FIG. 13, when four reactors are implemented in the substrate processing apparatus, the substrate processing apparatus may include four matching networks corresponding to the four reactors and one RF power generator connected to the four matching networks. That is, RF power is supplied to each reactor from one RF power generator at the same time. It should be noted that this configuration is distinct from an RF power generator that supplies RF power independently and individually to each reactor or an RF power generator connected to each reactor.

Figure 14:
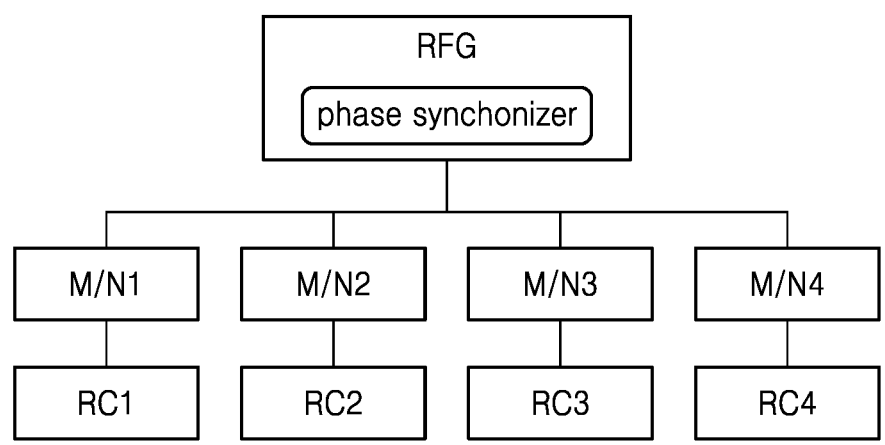
FIG. 14 is schematic view of FIG. 13.

FIG. 14 schematically shows FIG. 13. Referring to FIGS. 13 and 14, the RF power generator includes a function of synchronizing an RF frequency phase. The phase synchronizing functions to equalize phases of RF power frequencies transmitted from the RF power generator to each reactor so as to remove phase differences and to remove interference noises caused by phase differences in the RF power frequencies.

FIG. 15 is a view illustrating whether interference noise (Vpp noise) occurs when RF power is transmitted to each reactor by using an existing RF power supply device or by using an RF power supply device according to embodiments of the inventive concept.

FIG. 15A illustrates a case where an existing RF power supply device is applied and RF power is independently supplied to each reactor. As shown in FIG. 15A, phases of RF frequencies supplied by each RF power generator do not match, and an inter-reactor RF interference noise (Vpp noise) occurs. Therefore, the RF power supplied to one reactor affects matching of a matching network of another adjacent reactor, thereby impairing process stability and reproducibility in the reactor.

FIG. 15B illustrates a case where an RF power generator according to an embodiment is applied (see FIG. 14). In this embodiment, the RF power generator implements RF frequency phase synchronizing and supplies RF power to each reactor from one shared RF power generator. As can be seen from the above embodiment, no RF interference occurs during a process and the RF interference noise disappears.

Figure 16:
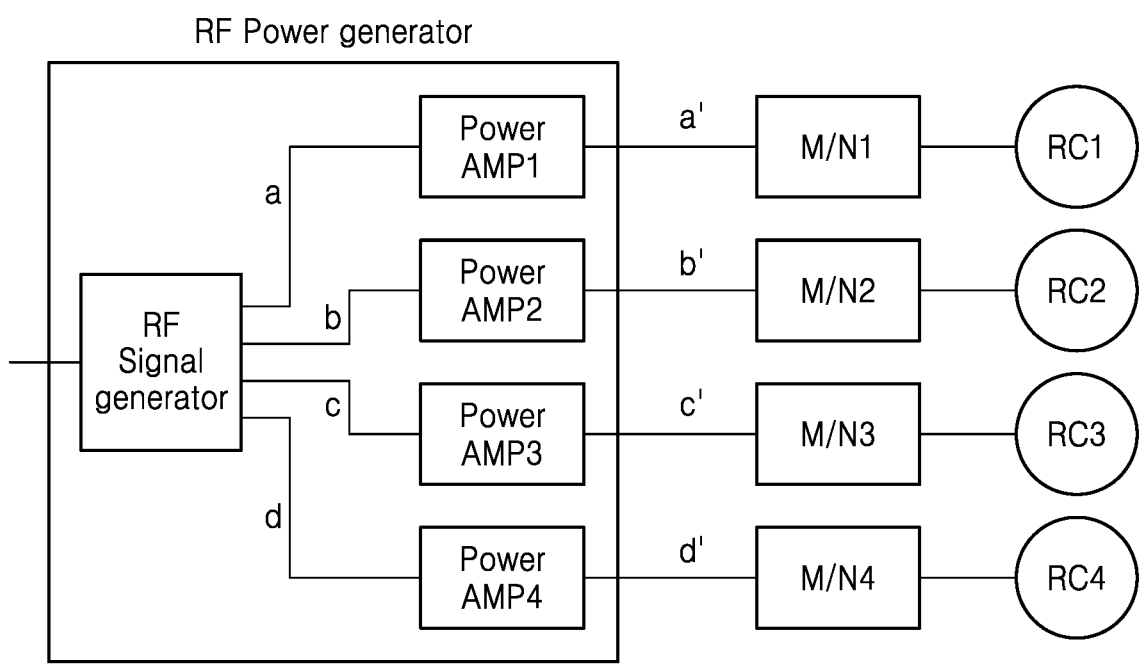
FIG. 16 is a view of a schematic structure of an RF power supply device of FIG. 14.

FIG. 16 is a view of a schematic structure of an RF power supply device of FIG. 14. Referring to FIG. 16, an RF power generator includes an RF signal generator and a power amplifier. The RF signal generator receives an external power source to generate an RF signal and synchronizes a frequency phase of the generated RF signal. The power amplifier converts the RF signal received from the RF signal generator into RF power. RF power with an identical phase is transmitted to each reactor via each matching network. In order to remove Vpp noise, while synchronizing the RF signal frequency function introduced in the disclosure, the lengths of RF power transmission cables connecting the RF signal generator, the power amplifier, and the matching network need to be the same.

To this end, as shown in FIG. 16, the lengths of the RF power transmission cables connecting the RF signal generator and each power amplifier are configured to be the same (a=b=c=d). In addition, the lengths of RF cables connecting each power amplifier and each matching network are also configured to be the same (a'=b'=c'=d'). To this end, power amplifiers within the RF power generator may be symmetrically arranged around the RF signal generator. In addition, each reactor and matching networks arranged therein may be symmetrically arranged around the RF power generator.

Figure 17:
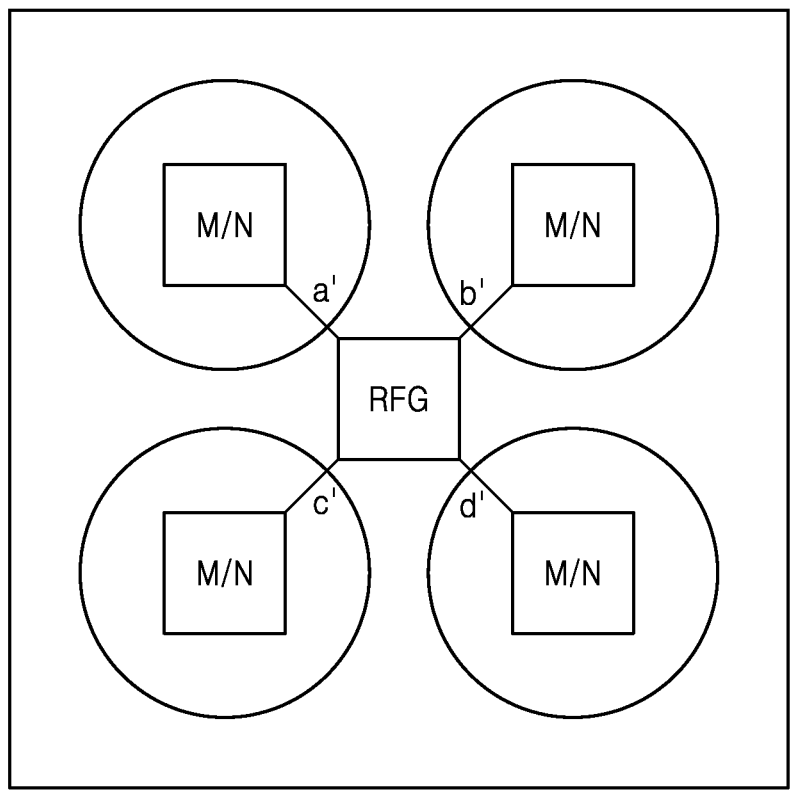
FIG. 17 is a view illustrating a state in which an RF power supply device according to embodiments of the inventive concept is arranged in a substrate processing apparatus including a plurality of reactors.

FIG. 17 is a view illustrating a state in which an RF power supply device according to embodiments of the inventive concept is arranged in a substrate processing apparatus including a plurality of reactors.

In FIG. 17, matching networks arranged in respective reactors are arranged symmetrically with respect to an RF power generator RFG, and the lengths of RF power transmission cables connecting the RF power generator and the matching networks are all the same (a'=b'=c'=d'). This, together with RF frequency phase synchronizing of the RF power generator, contributes to removing RF interference noise (Vpp noise). FIG. 17 illustrates four reactors, but the disclosure is not limited thereto. For example, when the RF power supply device includes a plurality of reactors such as three, five, or six, a matching network corresponding to each reactor, and an RF power generator, the matching networks and the reactors may be placed symmetrically equidistantly to the RF power generator to remove RF interference between the reactors.

FIG. 18 is a graph comparing RF forward power, RF reflect power, and corresponding interference noise (Vpp noise) generated during a plasma process using a conventional RF power supply device and an RF power supply device according to embodiments of the inventive concept.

Figures 18A, 18B:
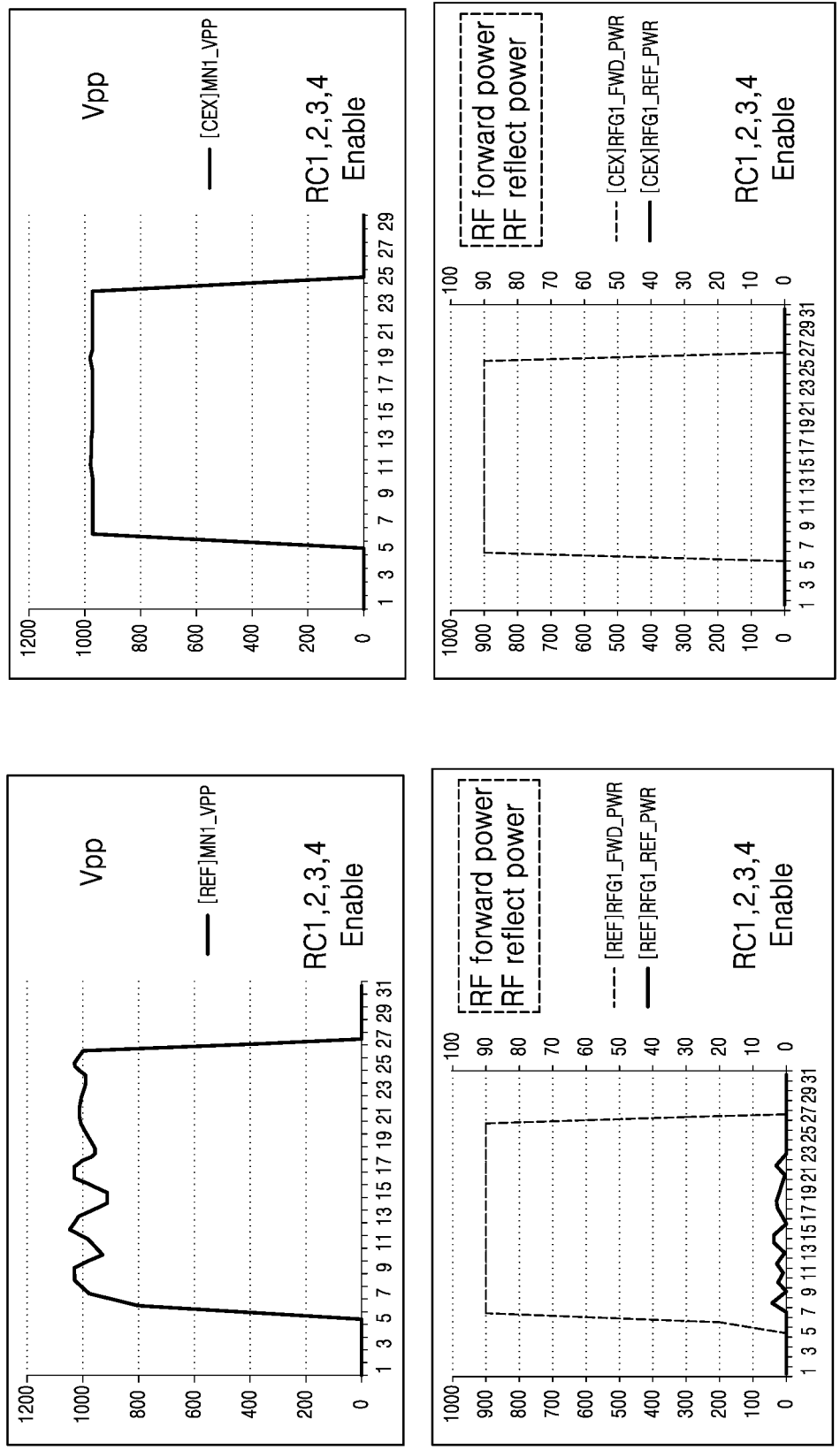
FIGS. 18A and 18B are graphs comparing RF forward power, RF reflect power, and corresponding interference noise (Vpp noise) generated during a plasma process using a conventional RF power supply device and an RF power supply device according to embodiments of the inventive concept.

FIG. 18A shows RF forward power, RF reflect power, and RF Interference noise (Vpp noise) when RF power is supplied to each reactor according to the conventional RF power supply device. FIG. 18A shows evaluation graphs for one reactor representatively of four reactors. Referring to FIG. 18A, since RF power frequencies applied to other adjacent reactors affect a matching network to be evaluated, it can be seen that matching is unstable, the RF reflect power is generated, and RF interference noise resulting in the Vpp noise is occurred.

FIG. 18B shows RF forward power, RF reflect power, and RF Interference noise (Vpp noise) when RF power is supplied to each reactor according to a power supply device according to embodiments of the inventive concept. FIG. 18B shows evaluation graphs for one reactor representatively of four reactors. Referring to FIG. 18B, since RF power frequencies applied to other adjacent reactors do not affect a matching network to be evaluated, it can be seen that waveforms of the graphs are stabilized without generating RF reflect power and generating noise in the Vpp.

It is to be understood that the shape of each portion of the accompanying drawings is illustrative for a clear understanding of the disclosure. It should be noted that the portions may be modified into various shapes other than the shapes shown.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing apparatus comprising:
a first reactor comprising a first power electrode and a first ground electrode;
a second reactor adjacent to the first reactor, the second reactor comprising a second power electrode and a second ground electrode;
a power generator configured to supply first power to the first power electrode and supply second power to the second power electrode; and
a controller,
wherein the power generator is further configured to synchronize phases of the first power and the second power and wherein the power generator comprises:
a signal generator configured to generate a first signal and a second signal that are phase-synchronized;
a first power generating portion configured to generate the first power based on the first signal; and
a second power generating portion configured to generate the second power based on the second signal,
wherein the signal generator comprises a first sensor, a second sensor, a comparator, and a splitter configured to generate a first RF signal and a second RF signal from a single RF signal,
wherein the first sensor detects a phase of the first RF signal,
wherein the second sensor detects a phase of the second RF signal,
wherein the comparator is configured to receive a signal from the first sensor, receive a signal from the second sensor, and to compare the signal from the first sensor and the signal from the second sensor and output a comparison signal,
wherein the splitter is further configured to adjust the phase of at least one of the first RF signal directed to the first power generating portion and the second RF signal directed to the second power generating portion based on the comparison signal, such that the first RF signal directed to the first power generating portion and the second RF signal directed to the second power generating portion are phase synchronized to form the first signal and the second signal,
wherein the first ground electrode and the second ground electrode are coupled to ground,
wherein at least one of the first power generating portion and the second power generating portion comprises:
a first amplifier configured to amplify a signal output from the signal generator and output a first amplified signal;
a second amplifier configured to amplify a signal output from the signal generator and output a second amplified signal; and a combiner configured to combine the first amplified signal and the second amplified signal to generate an output signal, wherein the controller is configured to compare a phase of the signal output from the signal generator with a phase of the output signal and transmit a comparison result to the combiner, and wherein the controller is configured to perform the functions of the first sensor and the second sensor.

2. The substrate processing apparatus of claim 1, wherein the first power generating portion and the second power generating portion are arranged symmetrically with respect to the signal generator.

3. The substrate processing apparatus of claim 1, further comprising:
a first power transmission line connecting the signal generator to the first power generating portion; and
a second power transmission line connecting the signal generator to the second power generating portion,
wherein a length of the first power transmission line and a length of the second power transmission line are the same.

4. The substrate processing apparatus of claim 1, wherein a phase of the signal output from the signal generator is compared with a phase of the first amplified signal, and the phase of the first amplified signal is adjusted according to a comparison result.

5. The substrate processing apparatus of claim 1, wherein the combiner is configured to receive the comparison result from the controller to change a phase of at least one of the first amplified signal and the second amplified signal based on the comparison result.

6. The substrate processing apparatus of claim 1, wherein the combiner is configured to receive the comparison result from the controller to change the phase of the output signal based on the comparison result.

7. The substrate processing apparatus of claim 1, wherein the controller is further configured to compare the output signal with a target power value and transmit a comparison result to at least one of the first amplifier and the second amplifier.

8. The substrate processing apparatus of claim 7, wherein at least one of the first amplifier and the second amplifier is further configured to receive the comparison result from the controller and adjust a gain.

9. The substrate processing apparatus of claim 1, further comprising:
a first matching network connected between the power generator and the first reactor; and
a second matching network connected between the power generator and the second reactor,
wherein the first matching network and the second matching network are arranged symmetrically with respect to the power generator.

10. The substrate processing apparatus of claim 9, further comprising:
a first power supply line connecting the power generator to the first matching network; and
a second power supply line connecting the power generator to the second matching network,
wherein a length of the first power supply line and a length of the second power supply line are the same.

11. The substrate processing apparatus of claim 1, wherein the first reactor comprises a first processing unit and a first substrate support unit, the second reactor comprises a second processing unit and a second substrate support unit, and the substrate processing apparatus further comprises a support portion configured to support at least a portion of the first reactor and at least a portion of the second reactor, wherein the support portion is capacitively coupled with at least one of the first processing unit and the first substrate support unit, and is capacitively coupled with at least one of the second processing unit and the second substrate support unit.

12. The substrate processing apparatus of claim 11, wherein at least one or both of the first substrate support unit and the second substrate support unit comprise an insulating heating block.

13. The substrate processing apparatus of claim 1, further comprising a third sensor to detect a phase of the first output signal, wherein an output of the third sensor is coupled to the controller.

14. A substrate processing apparatus comprising:
a signal generator comprising a single signal generator configured to output a single signal, the signal generator comprising:
a splitter configured to generate a first signal and a second signal from the single signal;
a first sensor to receive the first signal;
a second sensor to receive the second signal; and
a comparator configured to compare a signal from the first sensor and a signal from the second sensor;
a first amplifier configured to amplify the first signal and output a first amplified signal;
a second amplifier configured to amplify the first signal and output a second amplified signal;
a first combiner configured to combine the first amplified signal and the second amplified signal to generate a first output signal;
a third amplifier configured to amplify the second signal and output a third amplified signal;
a fourth amplifier configured to amplify the second signal and output a fourth amplified signal;
a second combiner configured to combine the third amplified signal and the fourth amplified signal to generate a second output signal;
a first matching network configured to receive the first output signal;
a second matching network configured to receive the second output signal; and
a controller configured to compare a phase of the first signal with a phase of the first output signal, transmit a comparison result to the first combiner, and perform the functions of the first sensor and the second sensor,
wherein the first sensor detects a phase of the first signal,
wherein the second sensor detects a phase of the second signal, and
wherein the splitter is further configured to adjust the phase of at least one of the first signal and the second signal based on the signal from the first sensor and the signal from the second sensor to thereby phase synchronize the first signal and the second signal.

15. The substrate processing apparatus of claim 14, wherein the controller is further configured to transmit a gain comparison result to the first amplifier and the second amplifier.

* * * * *